United States Patent [19]
Ikeda et al.

[11] Patent Number: 4,799,098
[45] Date of Patent: Jan. 17, 1989

[54] MOS/BIPOLAR DEVICE WITH STEPPED BURIED LAYER UNDER ACTIVE REGIONS

[75] Inventors: Takahide Ikeda, Tokorozawa; Atsuo Watanabe, Hitachiohta; Touji Mukai, Sanda; Masanori Odaka, Kodaira; Katsumi Ogiue, Hinode, all of Japan

[73] Assignee: Hitachi, Ltd., Tokyo, Japan

[21] Appl. No.: 37,123

[22] Filed: Apr. 10, 1987

Related U.S. Application Data

[63] Continuation of Ser. No. 682,004, filed as PCT JP84/00133 on Mar. 26, 1984, published as WO84/03996 on Oct. 11, 1984, abandoned.

[30] Foreign Application Priority Data

Mar. 28, 1983 [JP]  Japan ................................. 58-53077

[51] Int. Cl.⁴ ............................................. H01L 27/02
[52] U.S. Cl. ........................................ 357/43; 357/20; 357/23.3; 357/42; 357/48
[58] Field of Search ................. 357/23.3, 34, 43, 42, 357/44, 46, 20, 48

[56] References Cited

U.S. PATENT DOCUMENTS

| | | | |
|---|---|---|---|
| 3,885,998 | 5/1975 | Reinol | 357/44 |
| 3,961,340 | 6/1976 | Encinas | 357/44 |
| 4,242,691 | 12/1980 | Kotani et al. | 357/23.3 |
| 4,458,158 | 7/1984 | Mayrano | 357/46 |
| 4,532,003 | 7/1985 | Beasom | 357/34 |

FOREIGN PATENT DOCUMENTS

| | | | |
|---|---|---|---|
| 88399 | 9/1983 | European Pat. Off. | 357/23.3 |
| 50-37507 | 12/1975 | Japan . | |
| 53-80172 | 7/1978 | Japan | 357/23.3 |

OTHER PUBLICATIONS

W. Chin et al., "Integ. CKT . . . Devices," IBM Tech. Discl. Bull. vol. 16 #6, Nov. 1973, pp. 1985/1986.

Primary Examiner—Joseph E. Clawson, Jr.
Attorney, Agent, or Firm—Antonelli, Terry & Wands

[57] ABSTRACT

In a semiconductor device of the type in which a bipolar element and MOS field-effect transistors are formed on one surface of a semiconductor substrate, this invention discloses a semiconductor device characterized in that first buried layers of a first conductivity type are formed within regions of the semiconductor substrate in which the bipolar element are formed, a second buried layer of the first conductivity and at least one MOS field-effect transistor type is formed within the semiconductor substrate facing at least the emitter of the bipolar element, and the depth from one surface of the semiconductor substrate to the second buried layer of the first conductivity type is less than the depth from that surface to the first buried layer of the first conductivity type.

This invention can prevent any increase in the capacity of the MOS field-effect transistor, and can also improve the operating speed of the bipolar element.

14 Claims, 5 Drawing Sheets

MOS/BIPOLAR DEVICE WITH STEPPED BURIED LAYER UNDER ACTIVE REGIONS

This application is a continuation of application Ser. No. 682,004, filed as PCT JP84/00133 on Mar. 26, 1984, published as WO84/03996 on Oct. 11, 1984, now abandoned.

TECHNICAL FIELD

In a semiconductor device of the type in which a bipolar element and a MOS field-effect transistor are formed on the same semiconductor substrate, this invention relates to a semiconductor device that can realize a high-performance, bipolar transistor and MOS field-effect transistor, and to a method of producing such a semiconductor device.

BACKGROUND ART

Various techniques of forming a bipolar element and an MOS element on the same semiconductor substrate have long been attempted, but when high-speed LSI circuits are desired, these techniques have several problems that are still not solved. The problems in the prior art will now be described.

Figure 1:
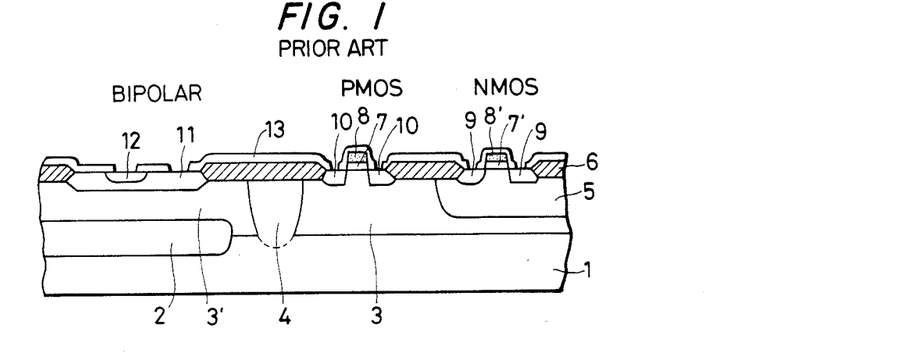
FIG. 1 is a section through the structure of conventional BiCMOS with no buried layer under the MOS portion thereof.

FIG. 1 is a section through the structure of a typical conventional BiCMOS semiconductor device. An n-type buried layer 2 and n-type epitaxial layers 3 and 3' are formed on a p-type substrate 1. A vertical NPN bipolar transistor is formed so that its base 11 and emitter 12 are formed within the epitaxial layer 3' over the buried layer 2. A PMOS field-effect transistor (hereinafter simply called a "PMOS") is formed by forming a gate oxide film 7, a polycrystalline silicon gate 8 and a source and drain 10 within a n-type epitaxial layer 3. An NMOS field-effect transistor (hereinafter simply called an "NMOS") consists of a gate oxide film 7', a gate polycrystalline silicon 8' and source and drain 9 inside a p-type well 5. Reference numeral 4 denotes a p-type device-isolation region which isolates the bipolar element from the PMOS.

In this structure, the impurity concentration in the n-type epitaxial layers 3 and 3' is usually controlled to be at most $10^{16}/cm^3$, in order to control the threshold voltage of the PMOS. For this reason, the epitaxial layer 3 must be at least 4 $\mu$m thick in order to insure the punch-through voltage (e.g., at least 10V) between the source and drain 10 of the PMOS and the p-type substrate 1. This means that the device-isolation region 4 must also be at least 4 $\mu$m depth, and the width of this region 4 raises one of the problems preventing a high integration density. If a 5 $\mu$m depth isolation layer is formed, for example, the width of the isolation layer is at least 10 $\mu$m, including its spreading in the lateral direction.

As described above, in the conventional structure shown in FIG. 1, the epitaxial layers 3 and 3' must be thick, so that the width of the device-isolation region is also large, raising a problem when increasing the integration density.

Figure 2:
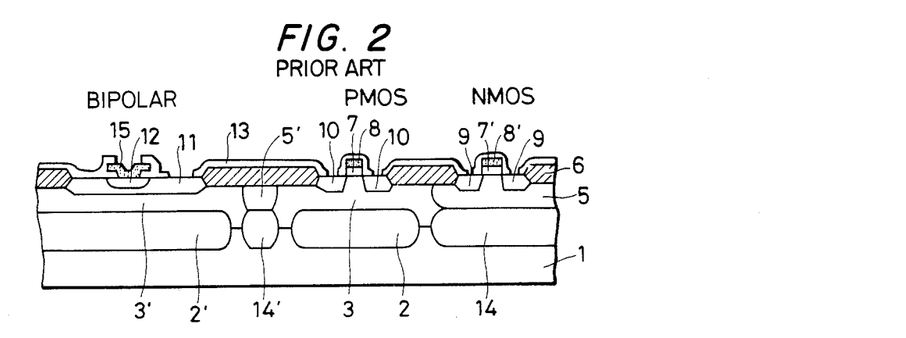
FIG. 2 is a section through the structure of a conventional BiCMOS device using a MOS structure with a buried layer.

FIG. 2 illustrates a prior-art technique which solves this problem ("BiMOS-A New Way to Simplify High Power Custom Interface", M. Heisig, IEEE, 1981).

The reference numerals in FIG. 2 have the same meaning as those in FIG. 1. The novel points of the structure of FIG. 2 compared with that of FIG. 1 are as follows.

(1) An n-type buried layer 2, which is the same as that below the bipolar element such as a bipolar transistor, is also formed below the PMOS. The buried layer 2 has an impurity concentration which is at least three orders of magnitude greater than that of the epitaxial layer 3, so that the punch-through described earlier does not occur, even when the thickness of the epitaxial layer 3 is reduced (e.g. to 2 $\mu$m thick).

(2) P-type buried layers 14 and 14' are formed below the NMOS and in the device-isolation region, respectively, with the p-type wells 5 and 5' on top, to form a p-type well region and a device-isolation region, respectively. As a result, deep diffusion is not necessary to provide device-isolation, and the width of the device-isolation region can be reduced to less than 7 $\mu$m, for instance.

As described above, the structure of FIG. 2 can realize a high density integration, but the following problems have yet to be solved in order to improve the MOS transistor performance as much as possible. When the n-type buried layers 2, 2' and the n-type epitaxial layers 3, 3' are used in common, the high-frequency characteristic (current gain bandwidth product $f_T$) of the bipolar device increases as the thickness of the epitaxial layer decreases, but the increase in the junction capacity of the MOS transistor reduces the operational speed of the CMOS circuit.

Figure 4:
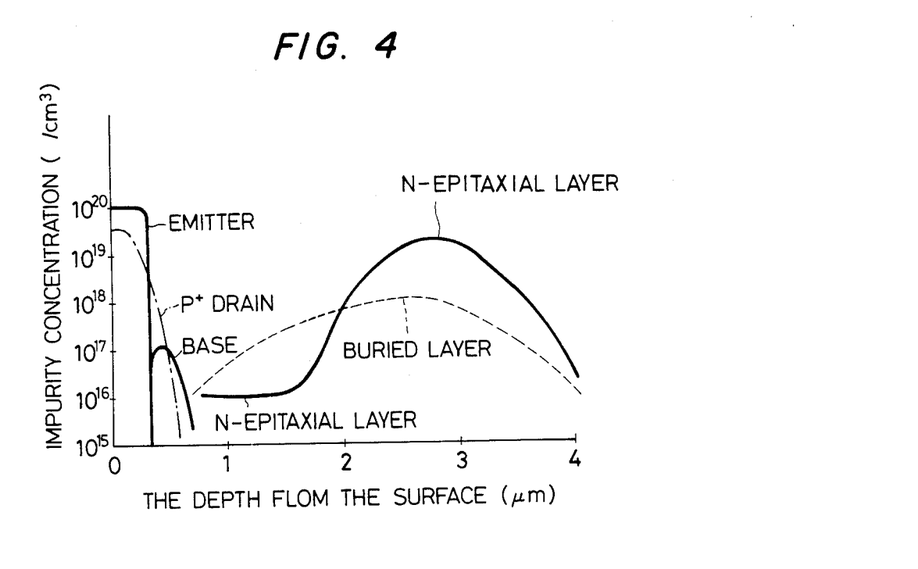
FIG. 4 is a graph of the impurity distribution in the conventional structure of the bipolar portion (solid line) and in the structure of the present invention (with that of the buried layer indicated by the broken line)
Figure 5:
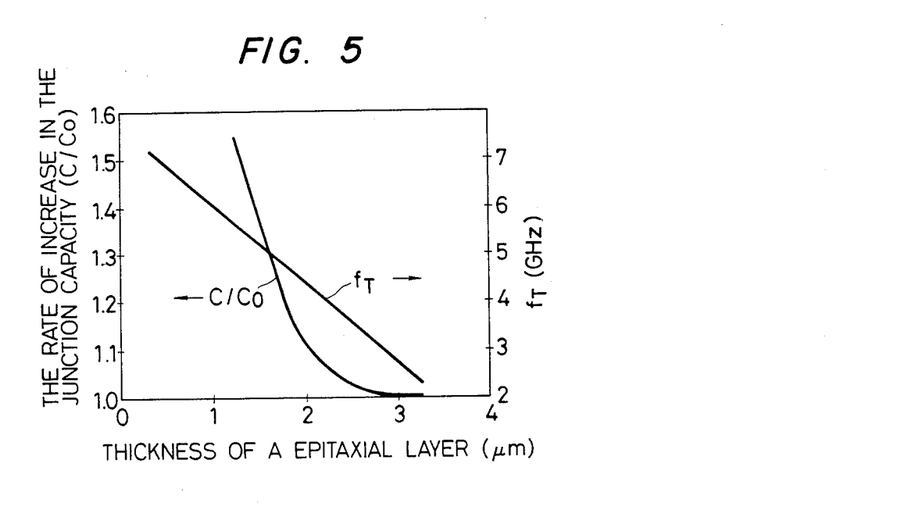
FIG. 5 is a graph of the dependency of the rate of increase in the junction capacity of a PMOS field effect transistor, and $f_T$ of a bipolar device, upon thickness of an epitaxial layer.

In order to explain this problem in detail, FIG. 4 shows an example of the impurity concentration distribution in the bipolar transistor portion and the PMOS portion, and FIG. 5 shows the relationship between $f_T$ of the bipolar element and the ratio of increase in the junction capacity of the PMOS, with the abscissa denoting the thickness of the epitaxial layers 3 and 3'. The thinner the epitaxial layer 3', the greater becomes $f_T$ because the time taken for the carriers to travel through the low-concentration collector layer occupies the major proportion thereof, beside the time taken for the carriers to travel through the base layer. On the other hand, the capacity of the junction between the source and drain of the PMOS (for a 5V reverse bias) increases rapidly when the thickness of the epitaxial layer 3 is less than 3 $\mu$m, for example, compared with the capacity $C_o$ when there is no n-type buried layer 2.

In the NMOS of FIG. 2, since the high concentration p-type buried layer 14 is formed on the substrate side thereof, the problem that a decrease in the thickness of the epitaxial layers 3, 3' results in an increase in the junction capacity occurs in the same way as in the PMOS.

As described above, the thickness of the epitaxial layers affects the performance of a bipolar element and that of a MOS transistor in opposite ways, and the prior-art technique has failed to solve this problem.

Recently, the gate length of MOS transistors has been reduced, because of the high-speed operation and the high integration density thereof. The problem in this case is that if the gate length is less than 2 $\mu$m, for example, the threshold voltage of the element drops dramatically because of a short-channel effect. To counteract this short-channel effect, a well structure called a "retrograde well", in which the concentration is higher at a portion further from the surface, has been proposed. In order to counteract the short-channel effect, however, the depth to the high-concentration layer must be less than 1 $\mu$m, and this can raise the problem of the increase of a source-drain capacitance.

DISCLOSURE OF INVENTION

In a semiconductor device of the type in which a bipolar element and a MOS field-effect transistor are formed on the same semiconductor substrate, the present invention is directed to providing a semiconductor device which can eliminate the problems in the prior art described above, and can increase the operational speed of the bipolar element without increasing the capacitance of the MOS field-effect transistor, and also to a method of producing such a semiconductor device.

In a semiconductor device of the type in which a bipolar element and a MOS field-effect transistor are formed on one surface of a semiconductor substrate, the semiconductor device in accordance with the present invention is characterized in that a first buried layer of a first conductivity type is formed within the semiconductor substrate in a region in which the bipolar element and at least one MOS field-effect transistor are formed, a second buried layer of a first conductivity type is formed within the semiconductor substrate at a portion which faces at least the emitter of the bipolar element, and the depth from one surface of the semiconductor substrate to the second buried layer of the first conductivity type is less than the depth from that surface of the substrate to the first buried layer.

In one preferred embodiment of the present invention, the second buried layer of the first conductivity type is formed within the semiconductor substrate facing the gate of the MOS field-effect transistor, and the depth from the surface of the substrate to the second buried layer is less than the depth from that surface to the first buried layer.

In another preferred embodiment of the invention, a first buried layer of a second conductivity type is formed within the semiconductor substrate in a region in which another MOS field-effect transistor (not the at least one MOS field effect transistor described above) is formed a second buried layer of the second conductivity type is formed within the semiconductor substrate facing the gate of that MOS field-effect transistor, and the depth from the surface to the second buried layer of the second conductivity type is less than the depth from that surface to the first buried layer of the second conductivity type.

In a method of producing a semiconductor device of the type in which a bipolar element and a MOS fieldeffect transistor are formed on one surface of a semiconductor substrate, the method of producing a semiconductor device in accordance with the present invention is characterized by the steps of forming a plurality of first buried layers consisting of a high concentration of an impurity of a first conductivity type on one surface of a semiconductor substrate of a predetermined conductivity type; forming a second buried layer consisting of a high concentration of an impurity having a diffusion coefficient greater than that of the high-concentration impurity of the first buried layer, within at least one of the first buried layers; forming an epitaxial layer of the first conductivity type over the semiconductor substrate including the first and second buried layers; and forming a bipolar element and a MOS field-effect transistor on the surface of the epitaxial layer corresponding to the first buried layers, and forming the emitter layer of the bipolar element on the surface of the epitaxial layer corresponding to at least one of the second buried layers.

In a preferred embodiment of the method of producing a semiconductor device in accordance with the present invention, the gate of the MOS field-effect transistor is formed on the surface of the epitaxial layer corresponding to at least one of the second buried layers.

In another preferred embodiment of the method of producing a semiconductor device in accordance with the present invention, an n-type impurity with a larger diffusion coefficient (e.g., phosphorus) than that of an n-type impurity used for forming a deep buried layer (e.g., antimony or arsenic) is used when forming a shallow buried layer, so that the depth thereof can be controlled by utilizing this difference in coefficients. When forming a shallow p-type buried layer below the gate of the NMOS, a p-type impurity with a larger diffusion coefficient (e.g., aluminum or gallium) than that of a p-type impurity used for forming a deep buried layer (e.g., boron) is used in the same way as that of the n-type layers; and when the same impurity (e.g., boron) is used, the impurity concentration is increased only at the portion at which the shallow buried layer will be formed.

BEST MODE FOR CARRYING OUT THE INVENTION

The present invention will now be described in detail with reference to some embodiments thereof. The production method in accordance with one embodiment of the invention will first be described, with reference to FIG. 3.

Figure 3A:
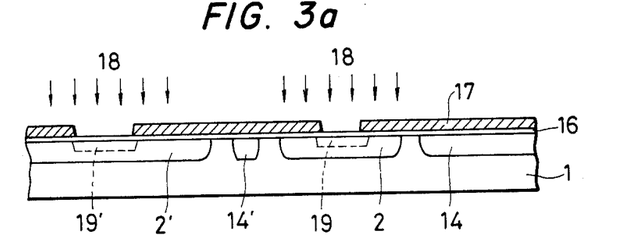
FIGS. 3a-3d are respectively sections through the structure, showing the structure at various steps in the principal production steps, in accordance with one embodiment of the present invention.

Referring to FIG. 3(a), first n-type buried layers (surface concentration: $10^{19}/cm^3$) 2, 2' of antimony and first p-type buried layers (surface concentration: $10^{18}/cm^3$) 14, 14' of boron are selectively formed on one main surface of a p-type semiconductor substrate 1 in the same way as the device of FIG. 2. After a thin oxidized film 16 (1000 Å thick) is formed, phosphorus 18 are implanted into regions at which the emitter of a bipolar transistor and the gate of a PMOS will be formed, using a photoresist film 17 as a mask, to form ion-implanted regions 19 and 19', respectively. The dosage thereof is $1 \times 10^{14}/cm^3$ at energy of 100 KeV.

Figure 3B:
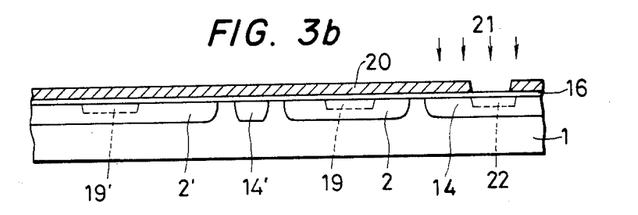

In FIG. 3(b), boron ions 21 are implanted into the region at which the gate of an NMOS will be formed, using a photoresist film 20 as the mask, to form the ion-implanted region 22 in the same way as in FIG. 3(a). The dosage thereof is $1 \times 10^{14}/cm^3$ at 100 KeV.

Figure 3C:
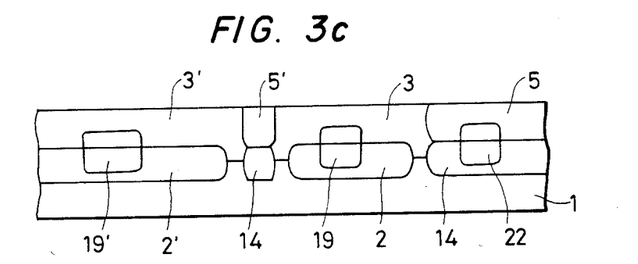

In FIG. 3(c), n-type epitaxial layers 3 and 3' are formed to a thickness of 2.5 μm after the ion implantation of FIG. 3(a) and 3(b) and a subsequent heat-treatment at 1,000° C. for 30 minutes, and thereafter p-type wells 5 and 5' are formed. The epitaxial layers 3 and 3' have an impurity concentration of $5 \times 10^{15}/cm^3$, and the p-well layers 5 and 5' are formed by implanting boron ions to concentration of $1 \times 10^{16}/cm^3$.

Figure 3D:
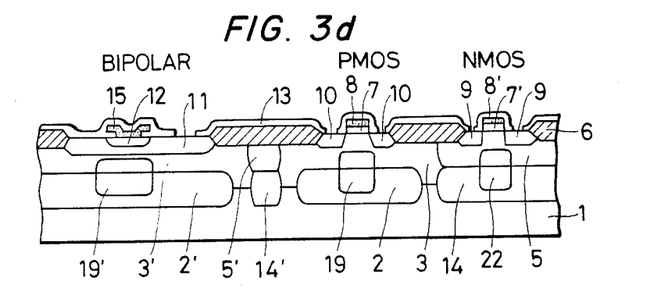

After the epitaxial layers 3, 3' and the p-well layers 5, 5' are formed, the structure shown in FIG. 3(d) is completed by a standard CMOS formation process, and one for forming a bipolar transistor provided with an emitter utilizing polycrystalline Si 15.

The heat-treatment conditions of all the processes after the epitaxial growth is at 1,000° C. for about 700 minutes, this heat-treatment diffuses the second n-type buried layers 19 and 19' above the first n-type buried layers 2 and 2', to provide the impurity distribution shown by the dashed line in FIG. 4. The coefficient of diffusion of antimony is $3 \times 10^{-2}$ (μm/hr$^{\frac{1}{2}}$) at 1,000° C. and is very different from that of phosphorus at that temperature, which is $1 \times 10^{-1}$ (μm/hr$^{\frac{1}{2}}$).

A second p-type buried layer 22 also provides an upward diffusion, in substantially the same way as the second n-type buried layer, forming a buried layer which is shallower than the first p-type buried layer 14.

In consequence, the depth of the second n-type buried layers 19, 19' formed of phosphorus is about 1 μm less than that of the first n-type buried layers 2, 2' formed of antimony, as shown in FIG. 4, and the depth from the surface thereof is 0.6 μm. The second p-type buried layer 22 of boron ions also has a depth of 0.6 μm (the first p-type buried layer 14 being 1.4 μm).

As a result, the inventors of this invention have confirmed that $f_T$ of the NPN bipolar transistor is improved from 3.5 GHz to 5.0 GHz. On the other hand, any increase in junction capacity in the source-drain region of the MOS transistor due to the first n-type buried layer 2 and the first p-type buried layer 14 can be neglected, because the epitaxial layers are sufficiently thick. In addition, the second n-type buried layer 19 and the second p-type buried layer 22 overlap the source and drain of the PMOS and NMOS transistors, respectively, but any increase in the junction capacity due to this overlapping is less than 10% because the area of superposition is about 10% of the source and drain areas.

On the other hand, the second n-type buried layer 19 and the second p-type buried layer 22 counteract the short-channel effect of the MOS device.

Figure 6:
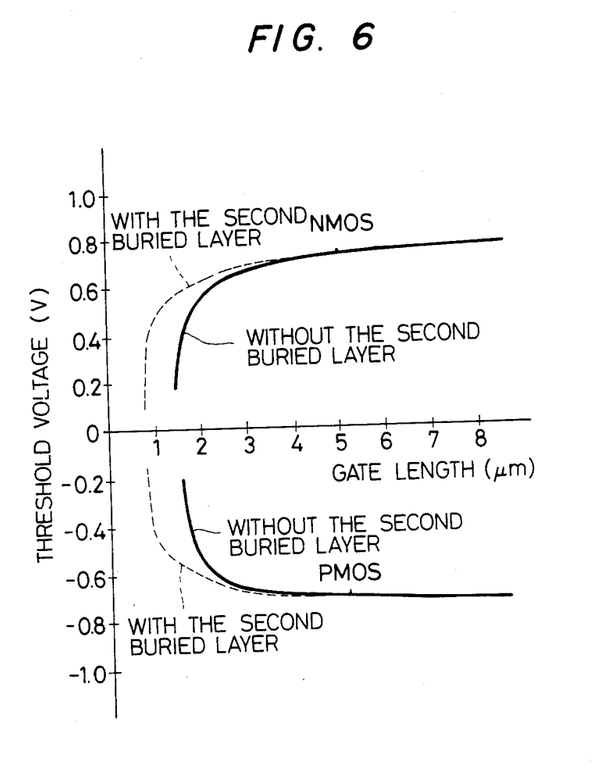
FIG. 6 is a graph of the counteraction of the short-channel effect of the threshold voltage of a MOS field-effect transistor provided with the buried structure in accordance with one embodiment of the present invention.

FIG. 6 is a graph in which the gate length is shown along the abscissa and the threshold voltage along the ordinate. As shown in this graph, the drop in threshold voltage is small even when the gate length is less than 2 μm, and the device can be used in practice even when the gate length is as little as about 1 μm.

As described above, the structure of this embodiment can solve the various problems of the BiCMOS structure. In other words, the high-frequency characteristic of a bipolar device can be improved with virtually no change in the junction capacity of a MOS transistor, and the short-channel effect resulting from the miniaturization of a MOS transistor can also be counteracted.

Figure 7:
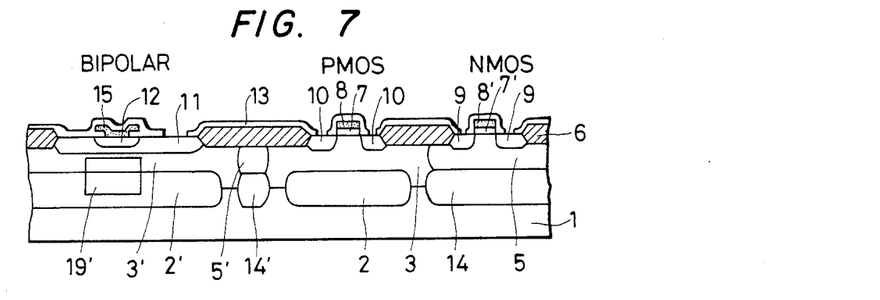
FIG. 7 is a schematic section through a second embodiment of the present invention.
Figure 8:
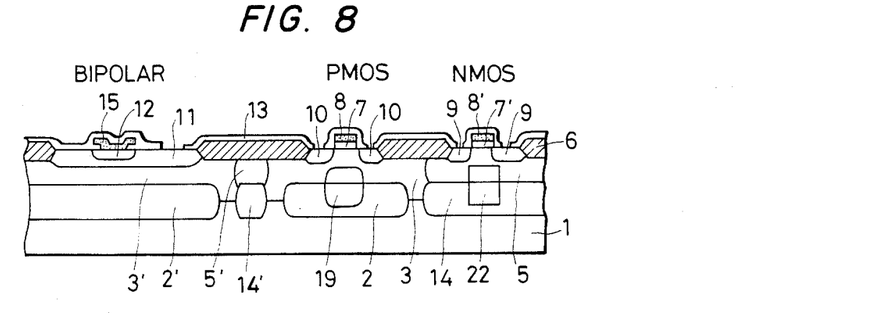
FIG. 8 is a schematic section through a third embodiment of the present invention.

The embodiment described illustrates a structure in which a second, shallow buried layer is formed in each of a bipolar device portion, an NMOS portion and a PMOS portion. However, the intended effect can also be obtained by forming the buried layer in only the bipolar portion, as shown in FIG. 7, or in only the NMOS or PMOS portion, as shown in FIG. 8, or by combining these options as suitable. The n-type second buried layers in the bipolar portion and PMOS portion in the embodiment of FIG. 3 can be formed by the same step, and hence the production process can be simplified.

As described above, the present invention can provide a semiconductor device in which it is possible to improve the operating speed of a bipolar device without increasing the junction capacity of a MOS fieldeffect transistor, and a method of producing such a semiconductor device.

What is claimed is:
1. A semiconductor device comprising:
   a semiconductor substrate having a major surface, and comprising a semiconductor body having an N-type semiconductor epitaxial layer thereon, said epitaxial layer having a relatively low impurity concentration, a surface of the epitaxial layer forming the major surface;
   a vertical type NPN bipolar transistor formed in said epitaxial layer, said vertical type NPN bipolar transistor including a base, an emitter and a collector;
   a P-channel MOS field-effect transistor formed in the epitaxial layer and adjacent to said vertical type NPN bipolar transistor, said P-channel MOS field-effect transistor including a source, a drain and a gate;
   an N-channel MOS field-effect transistor formed in a P-type well of a low impurity concentration provided adjacent to said P-channel MOS field-effect transistor, said N-channel MOS field-effect transistor including a source, a drain and a gate;
   first N-type buried layers, each having a relatively high impurity concentration, respectively formed in said semiconductor substrate under the base of said vertical type NPN bipolar transistor, and spaced from said base by a portion of the epitaxial layer, and formed under the P-channel MOS field-effect transistor, and spaced therefrom by a portion of the epitaxial layer;
   a first P-type buried layer, having a relatively high impurity concentration, formed in said semiconductor substrate under said N-channel MOS field-effect transistor and adjacent to said P-type well; and
   second N-type buried layers, each having a relatively high impurity concentration, respectively formed in said semiconductor substrate under said emitter of said vertical type NPN bipolar transistor, and under the gate, and below the source and drain, of said P-channel MOS field-effect transistor, overlapping respectively in part with said first N-type buried layers and facing respectively to the emitter of said vertical type NPN bipolar transistor and the gate of said P-channel MOS field-effect transistor, the second N-type buried layers having a portion of the epitaxial layer between the respective second N-type buried layer and the base of the vertical type NPN bipolar transistor and the P-channel MOS field-effect transistor, the respective depth to said second N-type buried layers from the major surface of said semiconductor substrate being shallower than the depth to said first N-type buried layers from the major surface of said semiconductor substrate.

2. The semiconductor device as defined in claim 1, wherein said second N-type buried layers respectively extend under the emitter, for a lateral distance substantially equal to the lateral width of the emitter, and under the gate of said P-channel MOS field-effect transistor, for a lateral distance substantially equal to the lateral width of the gate of said P-channel MOS field-effect transistor.

3. In a semiconductor device of the type in which a bipolar transistor, having emitter, base and collector regions, and at least two MOS field-effect transistors, each having a gate and source and drain regions, are formed in one major surface region of a semiconductor substrate, the one major surface region having a relatively low impurity concentration and extending from an exposed surface of the semiconductor substrate, the improvement wherein first buried layers of first conductivity type, each having a relatively high impurity concentration, are respectively formed within said semiconductor substrate under the base region of said bipolar transistor and under one of said MOS field-effect transistors, a second buried layer of first conductivity type, having a relatively high impurity concentration, is formed under the emitter of said bipolar transistor within said semiconductor substrate, overlapping in part with said first buried layer of first conductivity type under said bipolar transistor, the second buried layer of first conductivity type extending in a lateral direction for a distance substantially equal to the lateral width of the emitter of said bipolar transistor, and the depth from the exposed surface of said semiconductor substrate to the surface of said second buried layer of first conductivity type being less than the depth from the exposed surface of said semiconductor substrate to the surface of said first buried layer of first conductivity type under said bipolar transistor, a further second buried layer, having a relatively high impurity concentrion, of first conductivity type is formed under the gate and below the source and drain regions of said one of said MOS field-effect transistors within said semiconductor substrate, overlapping in part with said first buried layer of first conductivity type under said one of said MOS field-effect transistors, said further second buried layer of first conductivity type extending in a lateral direction for a distance substantially equal to the width of the gate of said one of said MOS field-effect transistors, and the depth from the exposed surface of said semiconductor substrate to the surface of said further second buried layer of first conductivity type being less than the depth from the exposed surface of the semiconductor substrate to the surface of said first buried layer of first conductivity type under said one of said MOS field-effect transistors; and wherein a first buried layer of second conductivity type, having a relatively high impurity concentration is formed under another of said MOS field-effect transistors, other than said one of said MOS field-effect transistors, within said semiconductor substrate, a second buried layer of second conductivity type, having a relatively high impurity concentration, is formed under the gate and below the source and drain of said another of said MOS field-effect transistors within said semiconductor substrate, overlapping in part with said first buried layer of second conductivity type under the another of said MOS field-effect transistors, said second buried layer of second conductivity type extending in a lateral direction for a distance substantially equal to the lateral width of the gate of said another of said MOS field-effect transistors, and the depth from the exposed surface of said semiconductor substrate to the surface of said second buried layer of second conductivity type being less than the depth from the exposed surface of said semiconductor substrate to the surface of said first buried layer of second conductivity type under the another of said MOS field-effect transistors, the first and second buried layers of first conductivity type, and the first and second buried layers of second conductivity type, being spaced apart from a respective MOS field-effect transistor or from the base region of the bipolar transistor by the major surface region having the relatively low impurity concentration.

4. The semiconductor device as defined in claim 1, further comprising a second P-type buried layer, having a high impurity concentration, formed in said semiconductor substrate under the gate of said N-channel MOS field-effect transistor and below the source and drain, of said N-channel MOS field-effect transistor, said second P-type buried layer being spaced from the N-channel MOS field-effect transistor by a portion of the P-type well, the second P-type buried layer overlapping in part with said first P-type buried layer, the depth to said second P-type buried layer from the major surface of said semiconductor substrate being shallower than that to said first P-type buried layer from the major surface of said semiconductor substrate.

5. The semiconductor device as defined in claim 4, wherein said second P-type buried layer extends for a lateral distance substantially equal to the lateral width of the gate of said N-channel MOS field-effect transistor.

6. The semiconductor device as defined in claim 4, wherein the impurities forming the second P-type buried layer is different than the impurities forming the first P-type buried layer.

7. The semiconductor device as defined in claim 7, wherein the impurities forming the second P-type buried layer are selected from the group consisting of aluminum and gallium, and boron is the impurity forming the first P-type buried layer.

8. The semiconductor device as defined in claim 7, wherein the impurities forming the second P-type buried layer are selected from the group consisting of aluminum and gallium, and boron is the impurity forming the first P-type buried layer.

9. The semiconductor device as defined in claim 7, wherein the impurities forming the first N-type buried layers are different than the impurities forming the second N-type buried layers.

10. The semiconductor device as defined in claim 9, wherein the impurities forming the second N-type buried layers have a larger diffusion coefficient than the impurities forming the first N-type buried layers.

11. The semiconductor device as defined in claim 10, wherein the impurities forming the second N-type buried layers are phosphorus, and the impurities forming the first N-type buried layers are selected from the group consisting of antimony and arsenic.

12. The semiconductor device as defined in claim 11, wherein the impurities forming the first N-type buried layers are different than the impurities forming the second N-type buried layers.

13. The semiconductor device as defined in claim 12, wherein the impurities forming the second N-type buried layers have a larger diffusion coefficient than the impurities forming the first N-type buried layers.

14. The semiconductor device as defined in claim 13, wherein the impurities forming the second N-type buried layers are phosphorus, and the impurities forming the first N-type buried layers are selected from the group consisting of antimony and arsenic.

* * * * *